United States Patent [19]
Tuan et al.

[11] Patent Number: 5,773,733
[45] Date of Patent: Jun. 30, 1998

[54] ALUMINA-ALUMINUM NITRIDE-NICKEL COMPOSITES

[75] Inventors: Wei-Hsing Tuan, Taipei; Wen-Bing Chou, Taipei Hsien; Shun-Tai Chang, Taipei, all of Taiwan

[73] Assignee: National Science Council, Taiwan

[21] Appl. No.: 631,369

[22] Filed: Apr. 12, 1996

[51] Int. Cl.[6] .............................. B22F 3/10; C22C 1/05; C22C 1/10; C22C 19/03

[52] U.S. Cl. ............................. 75/235; 75/244; 75/246; 419/13; 419/19; 419/45; 419/57

[58] Field of Search ................................. 419/19, 45, 13, 419/57; 75/235, 244, 246

[56] References Cited

U.S. PATENT DOCUMENTS

| | | | |
|---|---|---|---|
| 5,279,191 | 1/1994 | Buljan | 82/1.11 |
| 5,330,701 | 7/1994 | Shaw et al. | 419/10 |
| 5,366,686 | 11/1994 | Mortensen et al. | 419/5 |
| 5,460,640 | 10/1995 | Buljan | 75/233 |
| 5,538,533 | 7/1996 | Alexander et al. | 75/235 |

OTHER PUBLICATIONS

Alman et al., "Fabrication of Intermetallic Matrix Composites by Powder Injection Molding (PIM) Techniques", The Minerals, Metals & Materials Society pp. 109–125, 1991.

Liu et al., "Thermal Diffusivity, Heat Capacity and Thermal Conductivity in $Al_2O_3$–Ni Composite", Materials Science & Engineering B31:287–291, 1995.

Tuan et al., "The Preparation of $Al_2Oo_3$/Ni Composites by a Powder Coating Technique", Journal of Materials Science 30:855–859, 1995.

*Primary Examiner*—Daniel J. Jenkins
*Attorney, Agent, or Firm*—Fish & Richardson, P.C.

[57] ABSTRACT

The present invention provides an alumina-aluminum nitride-nickel ($Al_2O_3$-AlN-Ni) composite which can be prepared by pressureless sintering $Al_2O_3$ and NiAl alloy powders or by pressureless sintering $Al_2O_3$, Ni and Al powders in a nitrogen-containing atmosphere. The mechanical properties and the thermal conductivity of the obtained composite are better than those of alumina alone, while the electrical resistivity of the composite remains high. The composite thus is suitable for use as an electronic substrate or package.

18 Claims, No Drawings

ALUMINA-ALUMINUM NITRIDE-NICKEL COMPOSITES

FIELD OF THE INVENTION

The present invention relates to a novel ceramic composite, more particularly to an alumina-aluminum nitride-nickel ($Al_2O_3$—AlN—Ni) composite.

DESCRIPTION OF THE PRIOR ART

Alumina is superior in many aspects such as hardness, chemical stability and refractory character, therefore, alumina is frequently used as an electronic substrate or package. However, the application of alumina is often limited by its low toughness. Moreover, the thermal conductivity of alumina is too low, at only 10 W/m·k.

Many attempts have been made to improve the toughness and thermal conductivity of alumina. The thermal conductivity of a metal is higher than that of a ceramic material, therefore, incorporating metal powder into a ceramic material can increase the thermal conductivity of the ceramic. For example, incorporation of 5 vol % of nickel (Ni) can increase the thermal conductivity of alumina up to 30 W/m·k (Liu, D. M., Tuan, W. H., Chiu, C. C., Mater. Sci. & Eng., B31, p.287, 1995). The obtained alumina-nickel composite still has a high electrical insulation value, and the toughness of the composite is higher than that of alumina alone (Tuan, W. H., Wu, H. H., Yang, T. J., J. of Mater. Sci., 30, p.855, 1995). However, such an alumina-nickel composite suffers from the disadvantage that, due to the high thermal expansion coefficient of the metal, incorporation of the metal endows the composite with a higher thermal expansion coefficient than alumina alone. Therefore, when such an alumina-nickel composite is used as an electronic substrate or package, greater thermal stress between the composite and silicon wafer is induced to an undesirable degree.

Among the ceramic materials, aluminum nitride (AlN) has a higher thermal conductivity than that of alumina, and a thermal expansion coefficient close to that of the silicon wafer, which in turn leads to lower thermal stress between aluminum nitride and the silicon wafer, therefore, aluminum nitride is an excellent ceramic substrate material for use as an electronic substrate or package. However, since the bonding of aluminum nitride is by covalent bond, the production of aluminum nitride inevitably involves sintering or hot-pressing at temperatures in excess of 1800° C. in the presence of a sintering aid agent. Therefore, the cost of producing aluminum nitride substrate is much higher than that for alumina substrate.

SUMMARY OF THE INVENTION

Therefore, it is an object of the present invention to provide a novel ceramic composite which has higher toughness and thermal conductivity than alumina alone and is suitable for use as an electronic substrate or package.

To achieve the above object, the novel ceramic composite of the present invention is an alumina-aluminum nitride-nickel ($Al_2O_3$—AlN—Ni) composite, which can be prepared by pressureless sintering a powder mixture of $Al_2O_3$ and NiAl alloy or by pressureless sintering a powder mixture of $Al_2O_3$, Ni and Al in a nitrogen-containing atmosphere. The mechanical properties and the thermal conductivity of the composite are better than those of alumina alone, and the electrical resistivity of the composite remains high. The composite of the present invention thus is suitable for use as an electronic substrate or package.

DETAILED DESCRIPTION OF THE INVENTION

Thermal conductivities of both of aluminum nitride (AlN) and nickel (Ni) are higher than that of alumina ($Al_2O_3$), therefore, the inventors of the present invention set about incorporating aluminum nitride and nickel into alumina to increase the thermal conductivity of alumina. After a long period of diligent effort, the inventors of the present invention have synthesized an alumina-aluminum nitride-nickel ($Al_2O_3$—AlN—Ni) composite which can meet the need of higher thermal conductivity. In addition, the toughness of the obtained composite is higher than that of $Al_2O_3$ alone.

The alumina-aluminum nitride-nickel composite of the present invention includes 50 to 90 percent by volume of alumina ($Al_2O_3$), 1 to 35 percent by volume of aluminum nitride (AlN) and 1 to 16 percent by volume of nickel (Ni).

Having a high melting point, ceramic raw materials must be sintered at temperatures below the melting point to make the resultant ceramic product densified. However, it is not easy to achieve such densification when the raw material is a heterogeneous phase, that is, when the raw material contains more than one kind of powder. Nevertheless, even when the raw material is a heterogeneous powder form, by reaction sintering, the resultant $Al_2O_3$—AlN—Ni composite of the present invention can still be densified.

The raw materials for synthesizing the $Al_2O_3$—AlN—Ni composite of the present invention are alumina and nickel aluminide (NiAl) alloy. Specifically, the process for producing the $Al_2O_3$—AlN—Ni composite involves pressureless sintering a powder mixture of alumina and nickel aluminide alloy in a nitrogen-containing atmosphere.

Alumina powder and nickel aluminide alloy powder are mixed thoroughly by ball milling or attrition milling. Then, the powder mixture is subjected to sintering at an elevated temperature in a nitrogen-containing atmosphere. During sintering, nickel aluminide (NiAl) can react with nitrogen to form aluminum nitride (AlN) and Ni as follows:

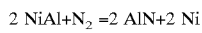

$$2\ NiAl + N_2 = 2\ AlN + 2\ Ni$$

Therefore, the $Al_2O_3$—AlN—Ni composite of the present invention is obtained.

The sintering is preferably carried out in a temperature range of 1500° to 1700° C. Sintering can also be carried out at below 1500° C., however, sintering above 1500° C. will result in densification of the obtained composite. The nitrogen-containing atmosphere may also contain hydrogen, for example, perhaps, a 5% $H_2$/95% $N_2$ atmosphere.

The amount of the alumina powder used is preferably 50 to 99 percent by volume and that of the nickel aluminide alloy (NiAl) powder used is preferably 1 to 50 percent, more preferably 1 to 40 percent by volume. If the addition amount of NiAl is added above 50 vol. %, the resultant composite contains too much Ni, exceeding the "percolation limit", then the Ni particles interconnect with each other, resulting in low electrical resistivity. Consequently, the obtained composite can not be used as an insulation substrate.

Alternatively, instead of using purchased nickel aluminide (NiAl) alloy, the nickel aluminide alloy powder used for preparing the $Al_2O_3$—AlN—Ni composites of the present invention can also be prepared by reacting nickel powder and aluminum powder. Ni powder and Al powder are thoroughly mixed by ball milling or attrition milling. Then, the powder mixture is subjected to reaction sintering, reaction hot-pressing, or reaction hot-isostatic-pressing to synthesize NiAl alloy or NiAl intermetallic (Alman, D. E. and Stoloff, N. S., *Engineering and Science Proceedings*, 15, No.5, p.710, 1994). For example, the powder mixture of Ni and Al is heated to within the range of 700° to 800° C. in a vacuum and maintained in that range for a period of time to obtain the NiAl alloy.

When the NiAl alloy is prepared by reacting Ni powder and Al powder, the Ni powder is preferably present in an amount of 1 to 15 parts by volume and the Al powder is preferably present in an amount of 1 to 35 parts by volume.

The $Al_2O_3$—AlN—Ni composite of the present invention thus produced demonstrates superior mechanical properties while maintaining high electrical resistivity. Since the thermal conductivities of both of AlN and Ni are higher than $Al_2O_3$, thus, the resultant $Al_2O_3$—AlN—Ni composite demonstrates higher thermal conductivity than $Al_2O_3$ alone. These results can be proved by the following non-limiting examples.

The following examples are intended to demonstrate this invention more fully without limiting its scope, since numerous modifications and variations will be apparent to those skilled in the art.

EXAMPLES 1–5

100 to 50 vol. % of alumina powder with an average particle size of 0.23 μm and 0 to 50 vol. % of nickel aluminide (NiAl) powder with an average particle size of 6 μm were attrition milled together in ethyl alcohol. The milling time was one hour. The grinding media used was zirconia balls. The slurry of the powder mixture was dried with a rotary evaporator. The dried lumps were crushed and sieved with a plastic sieve of 200 mesh. Powder compacts were formed by pressing uniaxially at 56 Mpa. The pressed specimen was placed in a covered graphite crucible, which was then placed in a box furnace, and sintered at 1600° C. for 1 hour.

The chemical composition of the obtained composite after sintering was determined by using electron probe microanalysis (EPMA) and X-ray diffractometry (XRD), which demonstrates that the obtained composites were $Al_2O_3$—AlN—Ni composites. The final density of the obtained composite was determined by the water displacement method. The bending strength of the specimens was determined by the four-point bending technique at ambient conditions. The fracture toughness was determined by the single-edge-notched-beam (SENB) technique. The electrical resistivity was determined by the 2-point technique. All the data of the obtained composites are shown in Table 1.

What is claimed is:

1. An alumina-aluminum nitride-nickel composite, comprising alumina ($Al_2O_3$), aluminum nitride (AlN) and nickel (Ni).

2. The alumina-aluminum nitride-nickel composite as claimed in claim 1, wherein said composite comprises 50 to 90 percent by volume of alumina ($Al_2O_3$), 1 to 35 percent by volume of aluminum nitride (AlN) and 1 to 16 percent by volume of nickel (Ni).

3. An alumina-aluminum nitride-nickel composite which is prepared by pressureless sintering a powder mixture of alumina and nickel aluminide alloy in a nitrogen-containing atmosphere.

4. The alumina-aluminum nitride-nickel composite as claimed in claim 3, wherein said composite is prepared by pressureless sintering a powder mixture of 50 to 99 percent by volume of alumina and 1 to 50 percent by volume of nickel aluminide alloy.

5. The alumina-aluminum nitride-nickel composite as claimed in claim 4, wherein the sintering is carried out at a temperature range of 1500° to 1700° C.

6. The alumina-aluminum nitride-nickel composite as claimed in claim 4, wherein the nickel aluminide alloy powder is present in an amount of 1 to 40 percent by volume.

7. The alumina-aluminum nitride-nickel composite as claimed in claim 4, wherein the nickel aluminide alloy powder is prepared by reacting nickel powder and aluminum powder.

8. The alumina-aluminum nitride-nickel composite as claimed in claim 7, wherein the nickel powder is present in an amount of 1 to 15 parts by volume and the aluminum powder is present in an amount of 1 to 35 parts by volume.

9. A process for producing an alumina-aluminum nitride-nickel composite, comprising mixing alumina powder with nickel aluminide alloy (NiAl) powder to form a powder mixture, and sintering the powder mixture in a nitrogen-containing atmosphere at 1500° to 1700° C. to form the alumina-aluminum nitride-nickel composite.

10. A process as claimed in claim 9, wherein said process comprises mixing 50 to 99 percent by volume of alumina powder with 1 to 50 percent by volume of nickel aluminide alloy (NiAl) powder to form a powder mixture.

11. The process as claimed in claim 10, wherein the nickel aluminide alloy powder is present in an amount of 1 to 40 percent by volume based on the powder mixture.

12. The process as claimed in claim 10, wherein the nickel aluminide alloy powder is prepared by reacting nickel powder and aluminum powder.

13. The process as claimed in claim 10, wherein the nickel aluminide alloy powder is prepared by reacting 1 to 15 parts by volume of nickel powder and 1 to 35 parts by volume of aluminum powder.

TABLE 1

| | | $Al_2O_3$—AlN—Ni composite | | | | Mechanical properties | | |
|---|---|---|---|---|---|---|---|---|
| Example | NiAl (vol %) | $Al_2O_3$ (vol %) | AlN (vol %) | Ni (vol %) | Relative density | Bending strength (Mpa) | Toughness (MPam$^{1/2}$) | Electrical resistivity (Ω-cm) |
| 1 | 0 | 100 | 0 | 0 | 100 | 362 | 3.4 | $1.1 \times 10^{14}$ |
| 2 | 5 | 93.4 | 4.3 | 2.3 | 100 | 480 | 4.1 | $6.3 \times 10^{13}$ |
| 3 | 10 | 87.1 | 8.5 | 4.4 | 100 | 463 | 4.5 | $4.1 \times 10^{12}$ |
| 4 | 20 | 75.0 | 16.5 | 8.5 | 100 | 413 | 4.7 | $3.1 \times 10^{10}$ |
| 5 | 40 | 53.0 | 31.0 | 16.0 | 96 | 406 | 6.0 | $3.4 \times 10^{8}$ |

14. An alumina-aluminum nitride-nickel composite which is produced by the process as claimed in claim 9.

15. An alumina-aluminum nitride-nickel composite which is produced by the process as claimed in claim 10.

16. An alumina-aluminum nitride-nickel composite which is produced by the process as claimed in claim 11.

17. An alumina-aluminum nitride-nickel composite which is produced by the process as claimed in claim 12.

18. An alumina-aluminum nitride-nickel composite which is produced by the process as claimed in claim 13.

* * * * *